(12) United States Patent
Chang et al.

(10) Patent No.: US 10,483,367 B2
(45) Date of Patent: Nov. 19, 2019

(54) VERTICAL GATE ALL AROUND (VGAA) DEVICES AND METHODS OF MANUFACTURING THE SAME

(71) Applicant: Taiwan Semiconductor Manufacturing Company, Ltd., Hsinchu (TW)

(72) Inventors: Chia-Hao Chang, Hsinchu (TW); Ming-Shan Shieh, Hsinchu (TW); Cheng-Long Chen, Hsinchu (TW); Chin-Chi Wang, New Taipei (TW); Chi-Wen Liu, Hsinchu (TW); Wai-Yi Lien, Hsinchu (TW); Chih-Hao Wang, Baoshan Township (TW)

(73) Assignee: Taiwan Semiconductor Manufacturing Company, Ltd., Hsin-Chu (TW)

( * ) Notice: Subject to any disclaimer, the term of this patent is extended or adjusted under 35 U.S.C. 154(b) by 20 days.

(21) Appl. No.: 15/872,361

(22) Filed: Jan. 16, 2018

(65) Prior Publication Data

US 2018/0138282 A1    May 17, 2018

Related U.S. Application Data

(60) Division of application No. 14/660,542, filed on Mar. 17, 2015, now Pat. No. 9,899,489, which is a
(Continued)

(51) Int. Cl.
*H01L 29/423* (2006.01)
*H01L 29/66* (2006.01)
(Continued)

(52) U.S. Cl.
CPC ........ *H01L 29/42392* (2013.01); *B82Y 10/00* (2013.01); *H01L 21/823807* (2013.01); *H01L 21/823885* (2013.01); *H01L 29/045* (2013.01); *H01L 29/0676* (2013.01); *H01L 29/0847* (2013.01); *H01L 29/41741* (2013.01); *H01L 29/6656* (2013.01); *H01L 29/66439* (2013.01); *H01L 29/66666* (2013.01); *H01L 29/775* (2013.01); *H01L 29/7827* (2013.01)

(58) Field of Classification Search
None
See application file for complete search history.

(56) References Cited

U.S. PATENT DOCUMENTS 8,188,537 B2    5/2012    Masuoka et al.
8,487,378 B2    7/2013    Goto et al.
(Continued)

FOREIGN PATENT DOCUMENTS

| JP | 2012004473 A | 1/2012 |
| KR | 20120139067 A | 12/2012 |
| WO | 2014069859 A1 | 5/2014 |

*Primary Examiner* — Robert K Carpenter
(74) *Attorney, Agent, or Firm* — Slater Matsil, LLP

(57) ABSTRACT

Vertical gate all around (VGAA) devices and methods of manufacture thereof are described. A method for manufacturing a VGAA device includes: exposing a top surface and sidewalls of a first portion of a protrusion extending from a doped region, wherein a second portion of the protrusion is surrounded by a gate stack; and enlarging the first portion of the protrusion using an epitaxial growth process.

20 Claims, 11 Drawing Sheets

Related U.S. Application Data continuation-in-part of application No. 14/621,628, filed on Feb. 13, 2015, now abandoned.

(51) Int. Cl.
*H01L 29/78* (2006.01)
*H01L 21/8238* (2006.01)
*H01L 21/283* (2006.01)
*H01L 21/02* (2006.01)
*B82Y 10/00* (2011.01)
*H01L 29/417* (2006.01)
*H01L 29/775* (2006.01)
*H01L 29/04* (2006.01)
*H01L 29/06* (2006.01)
*H01L 29/08* (2006.01)

(56) References Cited

U.S. PATENT DOCUMENTS

| | | |
|---|---|---|
| 8,729,634 B2 | 5/2014 | Shen et al. |
| 8,826,213 B1 | 9/2014 | Ho et al. |
| 8,887,106 B2 | 11/2014 | Ho et al. |
| 9,899,489 B2 * | 2/2018 | Chang .............. H01L 29/42392 |
| 2012/0319201 A1 | 12/2012 | Sun et al. |
| 2014/0282326 A1 | 9/2014 | Chen et al. |
| 2015/0170916 A1 | 6/2015 | Yu et al. |
| 2015/0259828 A1 | 9/2015 | Kang |
| 2016/0240623 A1 | 8/2016 | Chang et al. |

* cited by examiner

VERTICAL GATE ALL AROUND (VGAA) DEVICES AND METHODS OF MANUFACTURING THE SAME

PRIORITY CLAIM AND CROSS-REFERENCE

This application is a divisional of U.S. patent application Ser. No. 14/660,542, entitled "Vertical Gate All Around (VGAA) Devices and Methods of Manufacturing the Same," filed on Mar. 17, 2015, which is a continuation-in-part of U.S. patent application Ser. No. 14/621,628, entitled "Vertical Gate All Around (VGAA) Devices and Methods of Manufacturing the Same," filed on, Feb. 13, 2015, which patent applications are incorporated herein by reference.

BACKGROUND

As the semiconductor industry has progressed into nanometer technology nodes in pursuit of higher device density, higher performance, and lower costs, challenges from both fabrication and design issues have resulted in the development of three-dimensional designs, such as a vertical gate all around (VGAA) transistor. A typical VGAA transistor enables enhanced control of the charge carriers along the lengthwise direction through a complete encirclement of the channel region of a semiconductor nanowire by a gate dielectric and a gate electrode. The VGAA transistor has a reduced short channel effect (e.g. compared to a planar transistor), because the channel region may be surrounded by the gate electrode so that an effect of the source/drain region on an electric field of the channel region may be reduced (e.g. relative to a planar transistor).

However, VGAA transistors may suffer from high contact resistance and high parasitic capacitances. As such, improvements are needed in the manufacturing processes in order to manufacture VGAA transistors with lower contact resistances and lower parasitic capacitances.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1A:
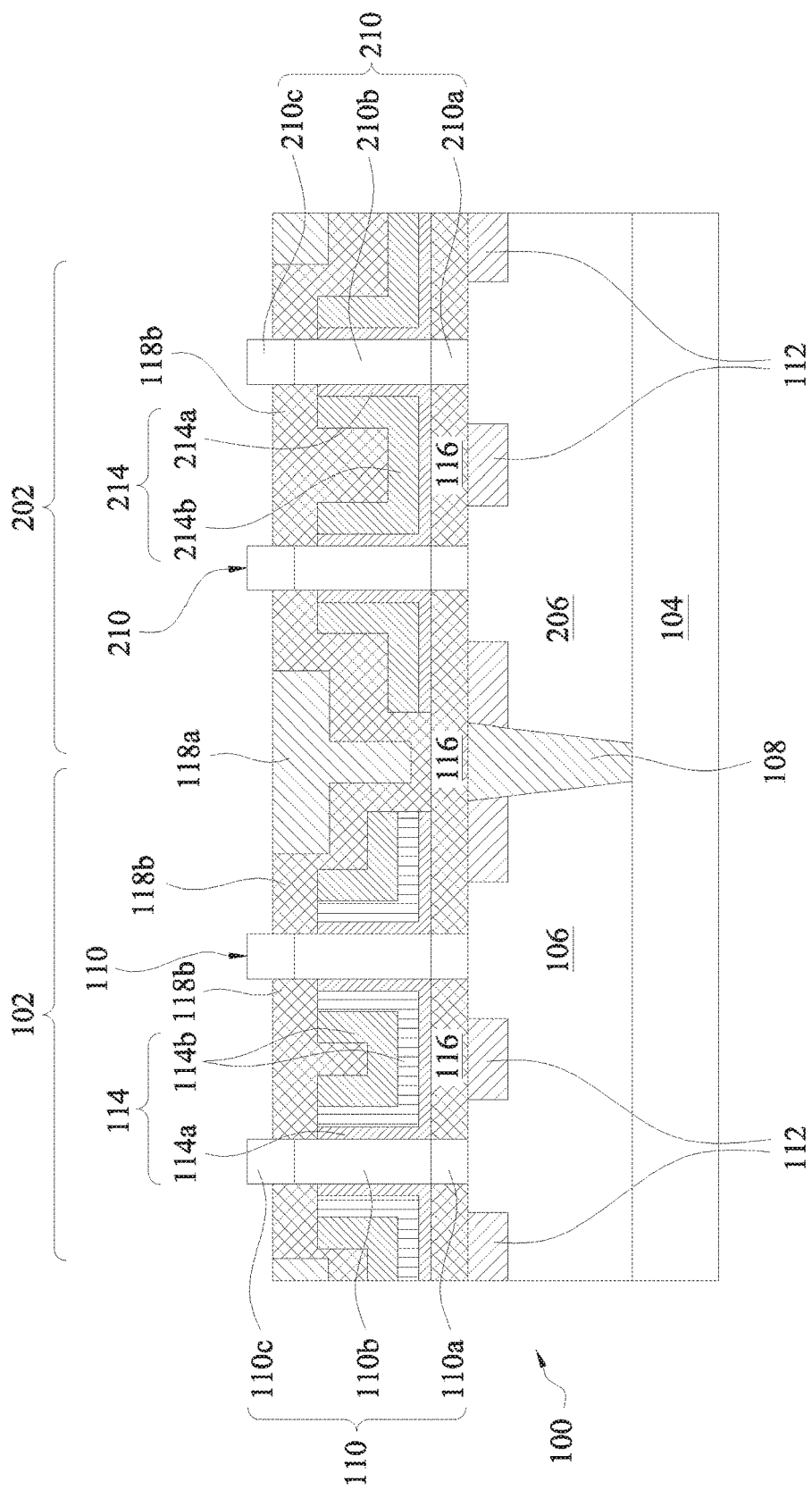
FIGS. 1A to 1H show a process flow illustrating various intermediary steps of manufacturing a semiconductor device having a first vertical gate all around (VGAA) device and a second VGAA device, in accordance with one or more embodiments.

The following disclosure provides many different embodiments, or examples, for implementing different features of the provided subject matter. Specific examples of components and stacks are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

FIGS. 1A to 1H show a process flow illustrating various intermediary steps of manufacturing a semiconductor device 100 having a first vertical gate all around (VGAA) device 102 and a second VGAA device 202, in accordance with one or more embodiments. As an example, the first VGAA device 102 may be an NMOS VGAA device, while the second VGAA device 202 may be a PMOS VGAA device.

The semiconductor device 100 may comprise a semiconductor substrate 104 over which the first VGAA device 102 and the second VGAA device 202 are formed. The semiconductor substrate 104 may be a semiconductor wafer and may comprise silicon (Si); germanium (Ge); a compound semiconductor including silicon carbide, gallium arsenic, gallium phosphide, indium phosphide, indium arsenide, and/or indium antimonide; an alloy semiconductor including SiGe, GaAsP, AlInAs, AlGaAs, GaInAs, GaInP, and/or GaInAsP; or combinations thereof. The semiconductor substrate 104 may be a bulk semiconductor substrate, a semiconductor-on-insulator (SOI) substrate, a multi-layered or gradient semiconductor substrate, or the like.

The semiconductor device 100 may include a first doped region 106 and a second doped region 206 laterally adjacent to and separated from the first doped region 106. The first doped region 106 may be a part or a portion of the first VGAA device 102, while the second doped region 206 may be a part or a portion of the second VGAA device 202. The first doped region 106 may have a first conductivity, while the second doped region 206 may have a second conductivity different from the first conductivity. For example, as described above, the first VGAA device 102 and the second VGAA device 202 may be an NMOS VGAA device and a PMOS VGAA device, respectively. In such an embodiment, the first doped region 106 may comprise a semiconductor material (such as silicon, germanium, silicon germanium, combinations of these, or the like) that contains N-type dopants (such as phosphorous or arsenic), while the second doped region 206 may comprise a semiconductor material (such as silicon, germanium, silicon germanium, combinations of these, or the like) that contains P-type dopants (such as boron or gallium).

The first doped region 106 and the second doped region 206 may be separated from each other by an isolation feature 108 (e.g. shallow-trench isolation feature). The isolation feature 108 may comprise an insulating material such as a dielectric material (e.g. silicon oxide or the like) and may serve to electrically isolate the first VGAA device 102 and the second VGAA device 202 from each other. The isolation feature 108 may be formed between the first doped region 106 and the second doped region 206 by etching a recess in the first doped region 106 and/or the second doped region 206 and filling the recess with the insulating material using, for example, a spin-on-dielectric (SOD) process, or any other suitable process.

The semiconductor device 100 may include first protrusions 110 (e.g. disposed over and extending from the first doped region 106) and second protrusions 210 (e.g. disposed over and extending from the second doped region 206). The first protrusions 110 may be a part or a portion of the first VGAA device 102, while the second protrusions 210 may be a part or a portion of the second VGAA device 202. In the embodiment shown in FIG. 1A, only two first protrusions 110 and only two second protrusions 210 are shown as an example. However, in other embodiments, the number of first protrusions 110 and/or the number of second protrusions 210 may be less than two (e.g. one) or more than two (e.g. three, four, or more). The first protrusions 110 and/or the second protrusions 210 may be shaped as nanowires. In other words, the first protrusions 110 and/or the second protrusions 210 may have a substantially circular shape, e.g. when viewed in a top-down view. Alternatively, the first protrusions 110 and/or the second protrusions 210 may be shaped as bars or fins, e.g. when viewed in a top-down view. These embodiments are described below in greater detail in respect of FIGS. 3A and 3B.

Referring to the first VGAA device 102, each of the first protrusions 110 may be a multi-layer semiconductor substrate comprising a source layer 110a, a channel layer 110b, and a drain layer 110c. In a particular embodiment, at least a portion of the source layers 110a, the channel layers 110b, and the drain layers 110c of the first protrusions 110 form the source regions, channel regions, and drain regions of the first VGAA device 102, respectively.

The source layers 110a, the channel layers 110b, and the drain layers 110c may comprise any suitable semiconductor material, such as silicon, germanium, silicon germanium, combinations of these, or the like. For example, in an embodiment, each of the source layers 110a, the channel layers 110b, and the drain layers 110c comprise doped silicon. However, in another embodiment, the channel layers 110b may comprise doped silicon, while the source layers 110a and the drain layers 110c comprise doped silicon germanium. In some embodiments, the source layers 110a may be formed by patterning a portion (e.g. an upper portion) of the first doped region 106. Consequently, in such embodiments, the source layers 110a may comprise a similar semiconductor material as the first doped region 106.

The semiconductor material of each of the source layers 110a, the channel layers 110b, and the drain layers 110c also comprises dopants that cause the source layers 110a, the channel layers 110b, and the drain layers 110c to have the same conductivity as the first doped region 106 (e.g. the first conductivity). For example, the first VGAA device 102 may be an NMOS VGAA device and, consequently, the source layers 110a, the channel layers 110b, and the drain layers 110c of the first protrusions 110 may be doped with N-type dopants such as phosphorous or arsenic.

In an embodiment, the dopant concentration of the first doped region 106, the source layers 110a, and the drain layers 110c may be substantially equal to one another and may, at the same time, be greater than the dopant concentration of the channel layers 110b. For example, the dopant concentration of the first doped region 106, the source layers 110a, and the drain layers 110c may be in a range from about $1\times10^{19}$ cm$^{-3}$ to about $1\times10^{22}$ cm$^{-3}$ or even greater, while the dopant concentration of the channel layers 110b may be less than about $1\times10^{18}$ cm$^{-3}$. In such an embodiment, the drain layers 110c may be highly doped drain regions of the first VGAA device 102.

In another embodiment, the dopant concentration of the first doped region 106 and the source layers 110a may be substantially equal to each other and may, at the same time, be greater than the dopant concentration of the channel layers 110b and the drain layers 110c. For example, the dopant concentration of the first doped region 106 and the source layers 110a may be in a range from about $1\times10^{19}$ cm$^{-3}$ to about $1\times10^{22}$ cm$^{-3}$ or even greater, while the dopant concentration of the channel layers 110b and the drain layers 110c may be less than about $1\times10^{18}$ cm$^{-3}$. In such an embodiment, the drain layers 110c may lowly or moderately doped drain regions of the first VGAA device 102.

The first doped region 106 and the first protrusions 110 may be formed by epitaxially growing semiconductor material (e.g. using a first epitaxial growth process) over at least a portion of the semiconductor substrate 104 and subsequently patterning the grown semiconductor material (e.g. using an etching process) to form the first protrusions 110 extending from the first doped region 106. In some embodiments, the first epitaxial growth process may be molecular beam epitaxy (MBE), liquid phase epitaxy (LPE), vapor phase epitaxy (VPE), selective epitaxial growth (SEG), or combinations thereof. Other epitaxial growth processes may also be possible. As described above, the source layers 110a may be formed by patterning a portion (e.g. an upper portion) of the first doped region 106. Consequently, the semiconductor material of the first doped region 106 and the source layers 110a may be formed using the same epitaxial growth process. Furthermore, in some embodiments, the semiconductor material of each of the source layers 110a, the channel layers 110b, and the drain layers 110c may be formed using the same epitaxial growth process. However, in another embodiment, different epitaxial growth processes may be used to form the semiconductor material of the source layers 110a, the channel layers 110b, and the drain layers 110c of the first protrusions 110.

As described above, the first doped region 106 and the first protrusions 110 comprise doped semiconductor material. In an embodiment, dopants are introduced into the semiconductor material of the first doped region 106, the source layers 110a, the channel layers 110b, and the drain layers 110c as the semiconductor material of each of these features is grown. As an example, during the epitaxial growth process of the semiconductor material of the first doped region 106, precursors that comprise the desired dopants are placed in situ into the reaction vessel along with the precursor reactants for the semiconductor material of the first doped region 106. As such, the dopants are introduced and incorporated into the semiconductor material of the first doped region 106 to provide the first doped region 106 the desired conductivity and dopant concentration while the semiconductor material of the first doped region 106 is grown. Although the example presented above is directed to the first doped region 106, a similar process may be used to introduce dopants into the semiconductor material of the channel layers 110b and the drain layers 110c as the semiconductor material of each of these layers is grown.

Alternatively, in another embodiment, dopants may be introduced into the semiconductor material of the first doped region 106, the source layers 110a, the channel layers 110b, and the drain layers 110c after the semiconductor material of each layer is grown. As an example, the semiconductor material of the first doped region 106 may be grown without the dopants, and an introduction process such as an implantation process or diffusion process is utilized to introduce the dopants into the material of the first doped region 106 after this epitaxial growth process, but before growing the material of the channel layers 110b. Once the dopants have been introduced into semiconductor material of the first doped region 106, an anneal process may be performed to activate the dopants. Thereafter, the epitaxial growth of the semiconductor material of the channel layers 110b may be commenced. Although the example presented above is directed to the first doped region 106, a similar process may be used to introduce dopants into the semiconductor material of the channel layers 110b, and the drain layers 110c after the semiconductor material of each of these layers is grown.

Referring to the second VGAA device 202, each of the second protrusions 210 may be a multi-layer semiconductor substrate comprising a source layer 210a, a channel layer 210b, and a drain layer 210c. In a particular embodiment, at least a portion of the source layers 210a, the channel layers 210b, and the drain layers 210c of the second protrusions 210 form the source regions, channel regions, and drain regions of the second VGAA device 202, respectively.

The source layers 210a, the channel layers 210b, and the drain layers 210c may comprise any suitable semiconductor material, such as silicon, germanium, silicon germanium, combinations of these, or the like. For example, in an embodiment, each of the source layers 210a, the channel layers 210b, and the drain layers 210c comprise doped silicon. However, in another embodiment, the channel layers 210b may comprise doped silicon, while the source layers 210a and the drain layers 210c comprise doped silicon germanium. In some embodiments, the source layers 210a may be formed by patterning a portion (e.g. an upper portion) of the second doped region 206. Consequently, in such embodiments, the source layers 210a may comprise a similar semiconductor material as the second doped region 206.

The semiconductor material of each of the source layers 210a, the channel layers 210b, and the drain layers 210c also comprises dopants that cause the source layers 210a, the channel layers 210b, and the drain layers 210c to have the same conductivity as the second doped region 206 (e.g. the second conductivity), which is different from the conductivity of the first doped region 106. For example, the second VGAA device 202 may be a PMOS VGAA device and, consequently, the source layers 210a, the channel layers 210b, and the drain layers 210c of the second protrusions 210 may be doped with P-type dopants such as boron or gallium.

In an embodiment, the dopant concentration of the second doped region 206, the source layers 210a, and the drain layers 210c may be substantially equal to one another and may, at the same time, be greater than the dopant concentration of the channel layers 210b. For example, the dopant concentration of the second doped region 206, the source layers 210a, and the drain layers 210c may be in a range from about $1 \times 10^{19}$ cm$^{-3}$ to about $1 \times 10^{22}$ cm$^{-3}$ or even greater, while the dopant concentration of the channel layers 210b may be less than about $1 \times 10^{18}$ cm$^{-3}$. In such an embodiment, the drain layers 210c may be highly doped drain regions of the second VGAA device 202.

In another embodiment, the dopant concentration of the second doped region 206 and the source layers 210a may be substantially equal to each other and may, at the same time, be greater than the dopant concentration of the channel layers 210b and the drain layers 210c. For example, the dopant concentration of the second doped region 206 and the source layers 210a may be in a range from about $1 \times 10^{19}$ cm$^{-3}$ to about $1 \times 10^{22}$ cm$^{-3}$ or even greater, while the dopant concentration of the channel layers 210b and the drain layers 210c may be less than about $1 \times 10^{18}$ cm$^{-3}$. In such an embodiment, the drain layers 210c may lowly or moderately doped drain regions of the second VGAA device 202.

The second doped region 206 and the second protrusions 210 may be formed by epitaxially growing semiconductor material (e.g. using a second epitaxial growth process) over at least a portion of the semiconductor substrate 104 and subsequently patterning the semiconductor material (e.g. using an etching process) to form the second protrusions 210 extending from the second doped region 206. In some embodiments, the second epitaxial growth process may be molecular beam epitaxy (MBE), liquid phase epitaxy (LPE), vapor phase epitaxy (VPE), selective epitaxial growth (SEG), or combinations thereof. Other epitaxial growth processes may also be possible. As described above, the source layers 210a may be formed by patterning a portion (e.g. an upper portion) of the second doped region 206. Consequently, the semiconductor material of the second doped region 206 and the source layers 210a may be formed using the same epitaxial growth process. Furthermore, in some embodiments, the material of each of the source layers 210a, the channel layers 210b, and the drain layers 210c may be formed using the same epitaxial growth process. However, in another embodiment, different epitaxial growth processes may be used to form the material of the source layers 210a, the channel layers 210b, and the drain layers 210c of the second protrusions 210.

As described above, the second doped region 206 and the second protrusions 210 comprise doped semiconductor material. In an embodiment, dopants are introduced into the semiconductor material of the second doped region 206 and the second protrusions 210 as the semiconductor material of each of these features is grown. The description given above in respect of introducing dopants into the semiconductor material of the first doped region 106, the source layers 110a, the channel layers 110b, and the drain layers 110c as the semiconductor material of each of these layers is grown may analogously apply to introducing dopants into the semiconductor material of the second doped region 206, the source layers 210a, the channel layers 210b, and the drain layers 210c as the semiconductor material of each of these layers is grown.

Alternatively, in another embodiment, dopants may be introduced into the semiconductor material of the second doped region 206 and the second protrusions 210 after the semiconductor material of each layer is grown. The description given above in respect of introducing dopants into the semiconductor material of the first doped region 106, the source layers 110a, the channel layers 110b, and the drain layers 110c after the semiconductor material of each of these layers is grown may analogously apply to introducing dopants into the semiconductor material of the second doped region 206, the source layers 210a, the channel layers 210b, and the drain layers 210c after the semiconductor material of each of these layers is grown.

As shown in FIG. 1A, the semiconductor device 100 may include first silicide regions 112 and second silicide regions 212. The first silicide regions 112 may be formed in portions of the first doped region 106 proximal the source layers 110a of the first protrusions 110 and may be used for integrated device contacts to the source layers 110a of the first VGAA device 102. As an example, the first silicide regions 112 may be disposed around the source layers 110a of the first protrusions 110, e.g. when viewed in a top-down view. In like manner, the second silicide regions 212 may be formed in portions of the second doped region 206 proximal the source layers 210a of the second protrusions 210 and may be used for integrated device contacts to the source layer 210a of the second VGAA device 202. As an example, the second silicide regions 212 may be disposed around the source layers 210a of the second protrusions 210, e.g. when viewed in a top-down view.

The first silicide regions 112 and the second silicide regions 212 may be formed using a silicide process or other suitable methods, e.g. after the patterning process that forms the first protrusions 110 and the second protrusions 210. The first silicide regions 112 and the second silicide regions 212 may comprise one or more metal species that can be used to form silicide compounds of the first silicide regions 112 and the second silicide regions 212. For example, the first silicide regions 112 and the second silicide regions 212 can comprise silicide compounds of titanium (e.g. $TiSi_2$), cobalt (e.g. $CoSi_2$), nickel (e.g. NiSi), combinations thereof, or the like.

As shown in FIG. 1A, the semiconductor device 100 may include first gate stacks 114 disposed adjacent to (e.g. surrounding) the channel layers 110b of the first protrusions 110, and second gate stacks 214 disposed adjacent to (e.g. surrounding) the channel layers 210b of the second protrusions 210. For example, the first gate stacks 114 may encircle all sides of the channel layers 110b of the first protrusions 110, while the second gate stacks 214 may encircle all sides of the channel layers 210b of the second protrusions 210, e.g. when viewed in a top-down view.

The first gate stacks 114 and the second gate stacks 214 may be disposed over a first spacer layer 116 formed over the first silicide regions 112 and the second silicide regions 212 and around the source layers 110a and 210a of the first protrusions 110 and the second protrusions 210. A portion of the first spacer layer 116 may also be disposed over the isolation feature 108, as shown in FIG. 1A. The first spacer layer 116 may be used to provide an insulating layer that prevents the first gate stacks 114 from electrically contacting the underlying first doped region 106. The first spacer layer 116 also prevents the second gate stacks 214 from electrically contacting the underlying second doped region 206.

In some embodiments, the first spacer layer 116 may comprise a dielectric material, such as silicon nitride, for example, formed using any suitable process, such as, CVD, PVD, ALD, and the like. In some embodiments, the deposition of first spacer layer 114 may be a conformal process that is performed after the formation of the first silicide regions 112 and the second silicide regions 212. An etch back process may be subsequently performed to remove excess portions of first spacer layer 116 from the top surfaces of the first protrusions 110 and the second protrusions 210, from sidewalls of the drain layers 110c and 210c, and from sidewalls of the channel layers 110b and 210b.

Each of the first gate stacks 114 may include a conformal first gate dielectric 114a and a first gate electrode 114b formed over first gate dielectric 114a. In like manner, each of the second gate stack 214 may include a conformal second gate dielectric 214a and a second gate electrode 214b formed over second gate dielectric 214a. The first gate dielectric 114a and the second gate dielectric 214a may include silicon oxide, silicon nitride, or multilayers thereof. Additionally or alternatively, the first gate dielectric 114a and the second gate dielectric 214a may include a high-k dielectric material. In such embodiments, first gate dielectric 114a and the second gate dielectric 214a may include a metal oxide or a silicate of hafnium (Hf), aluminum (Al), zirconium (Zr), lanthanum (La), magnesium (Mg), barium (Ba), titanium (Ti), lead (Pb), combinations thereof, and the like. The first gate dielectric 114a and the second gate dielectric 214a may be formed by molecular beam deposition (MBD), ALD, PECVD, and the like.

The first gate electrode 114b and the second gate electrode 214b may include a metal-containing material such as titanium nitride (TiN), tantalum nitride (TaN), tantalum carbon (TaC), cobalt (Co), ruthenium (Ru), aluminum (Al), combinations thereof, multi-layers thereof, and the like. In the example shown in FIG. 1A, the first gate electrode 114b comprises a multi-layer structure that is conformally formed over the first gate dielectric 114a. However, in other embodiments, the first gate electrode 114b may comprise a single-layer structure. In the example shown in FIG. 1A, the second gate electrode 214b comprises a single-layer structure that is conformally formed over the second gate dielectric 214a. However, in other embodiments, the second gate electrode 214b may comprise a multi-layer structure.

The first gate electrode 114b and second gate electrode 214b in FIG. 1A are conformally formed over the first gate dielectric 114a and the second gate dielectric 214a, respectively. However, in other embodiments, the first gate electrode 114b and the second gate electrode 214b may not be a conformal structure and, instead, may be formed using a suitable deposition process such as MBD, ALD, PECVD, and the like. In such embodiments, an etch back process may be performed to remove excess portions of the first gate electrode 114b from top surfaces of the first protrusions 110 and from sidewalls of the drain layers 110c of the first protrusions 110. This etch back process may also remove excess portions of the second gate electrode 214b from top surfaces of the second protrusions 210 and from sidewalls of the drain layers 210c of the second protrusions 210.

The semiconductor device 100 may further include a second spacer layer 118a, 118b disposed over the first gate stack 114 and the second gate stack 214. The second spacer layer 118a, 118b may comprise an oxide layer 118a (e.g. silicon oxide or silicon dioxide) and/or a nitride layer 118b (e.g. silicon nitride). The second spacer layer 118a, 118b may be formed using any suitable process, such as, CVD, PVD, ALD, and the like. An etch back process may be performed to remove excess portions of the second spacer layer 118 from the top surfaces of the first protrusions 110 and the second protrusions 210, and from at least a portion of the sidewalls of the drain layers 110c and 210c of the first protrusions 110 and the second protrusions 210, as shown in FIG. 1A. Accordingly, the top surfaces of the drain layers 110c and 210c and at least a portion of the sidewalls of the drain layers 110c and 210c may be exposed and subjected to the process flow steps that follow.

In the process steps that follow, the drain layers 110c of the first protrusions 110 and the drain layers 210c of the second protrusions 210 may be enlarged using, for example, an epitaxial growth process. The description that follows shows an example of epitaxially growing the drain layers 110c of the first protrusions 110 prior to epitaxially growing the drain layers 210c of the second protrusions 210. However, in another embodiment, the drain layers 110c of the first protrusions 110 may be epitaxially grown after epitaxially growing the drain layers 210c of the second protrusions 210. In yet another embodiment, the drain layers 110c of the first protrusions 110 may be epitaxially grown, while the drain layers 210c of the second protrusions 210 are kept without enlargement. In still another embodiment, the drain layers 210c of the second protrusions 210 may be epitaxially grown, while the drain layers 110c of the first protrusions 110 are kept without enlargement. The relevant process flow steps presented in the description that follows may be applied to these other embodiments.

Figure 1B:
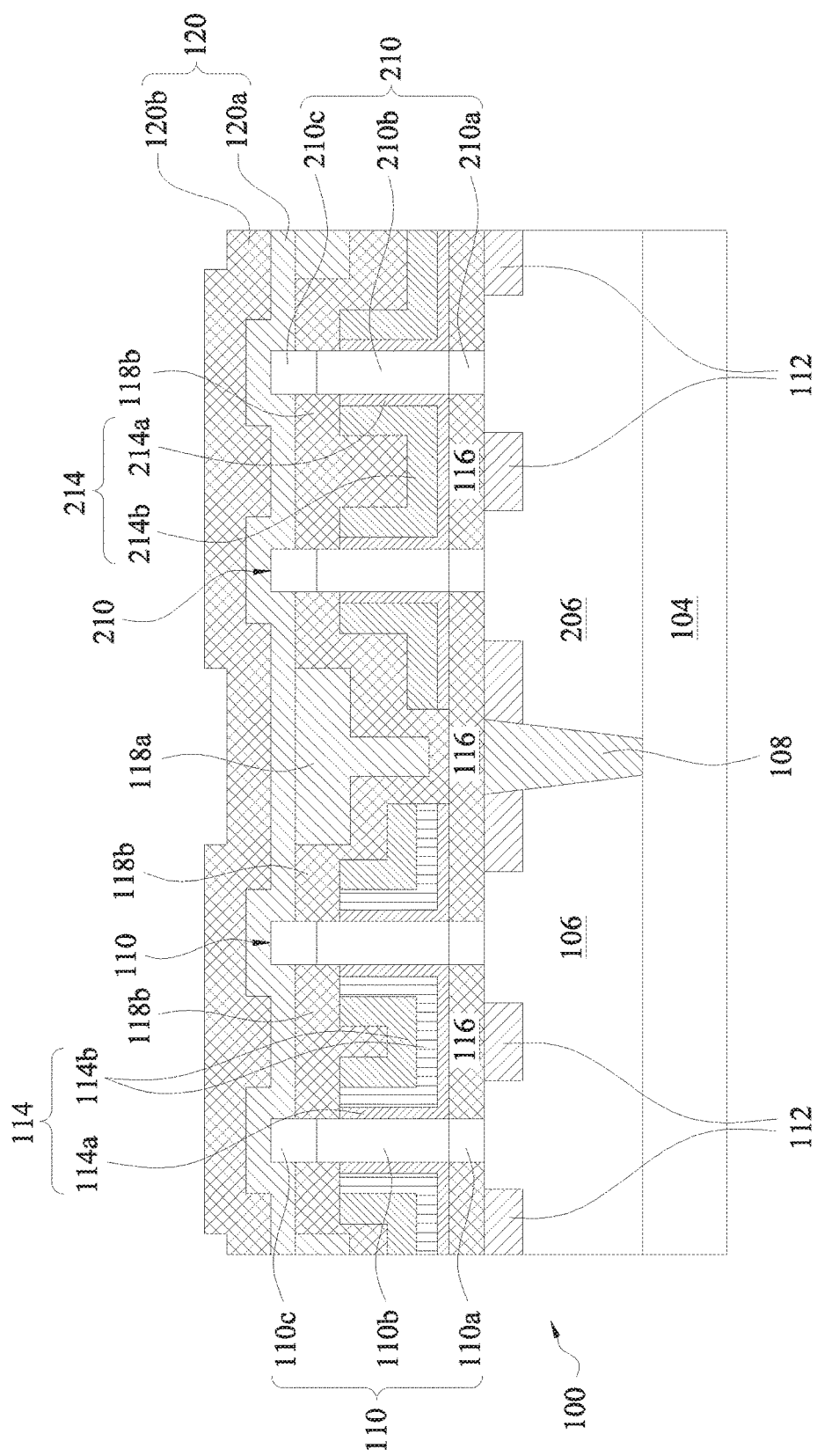

As shown in FIG. 1B, a first hard mask 120 may be formed (e.g. conformally formed) over the second spacer layer 118, the first protrusions 110, and the second protrusions 210. The first hard mask 120 may completely cover exposed surfaces of the second spacer layer 118a, 118b, the first protrusions 110, and the second protrusions 210. Consequently, the first hard mask 120 may cover the exposed sidewalls of the drain layers 110c of the first protrusions 110 and the exposed sidewalls of the drain layers 210c of the second protrusions 210.

The first hard mask 120 may include an oxide layer 120a (e.g. comprising silicon oxide or silicon dioxide) and a nitride layer 120b (e.g. comprising silicon nitride) formed over the oxide layer 120a. The oxide layer 120a and the nitride layer 120b of the first hard mask 120 may be formed using a suitable process such as chemical vapor deposition, plasma enhanced chemical vapor deposition, atomic layer deposition, or the like. However, other suitable methods of forming the oxide layer 120a and the nitride layer 120b of the first hard mask 120 may be utilized. The first hard mask 120 may be formed to a thickness of between about 2 nm and about 60 nm, such as about 40 nm.

Figure 1C:
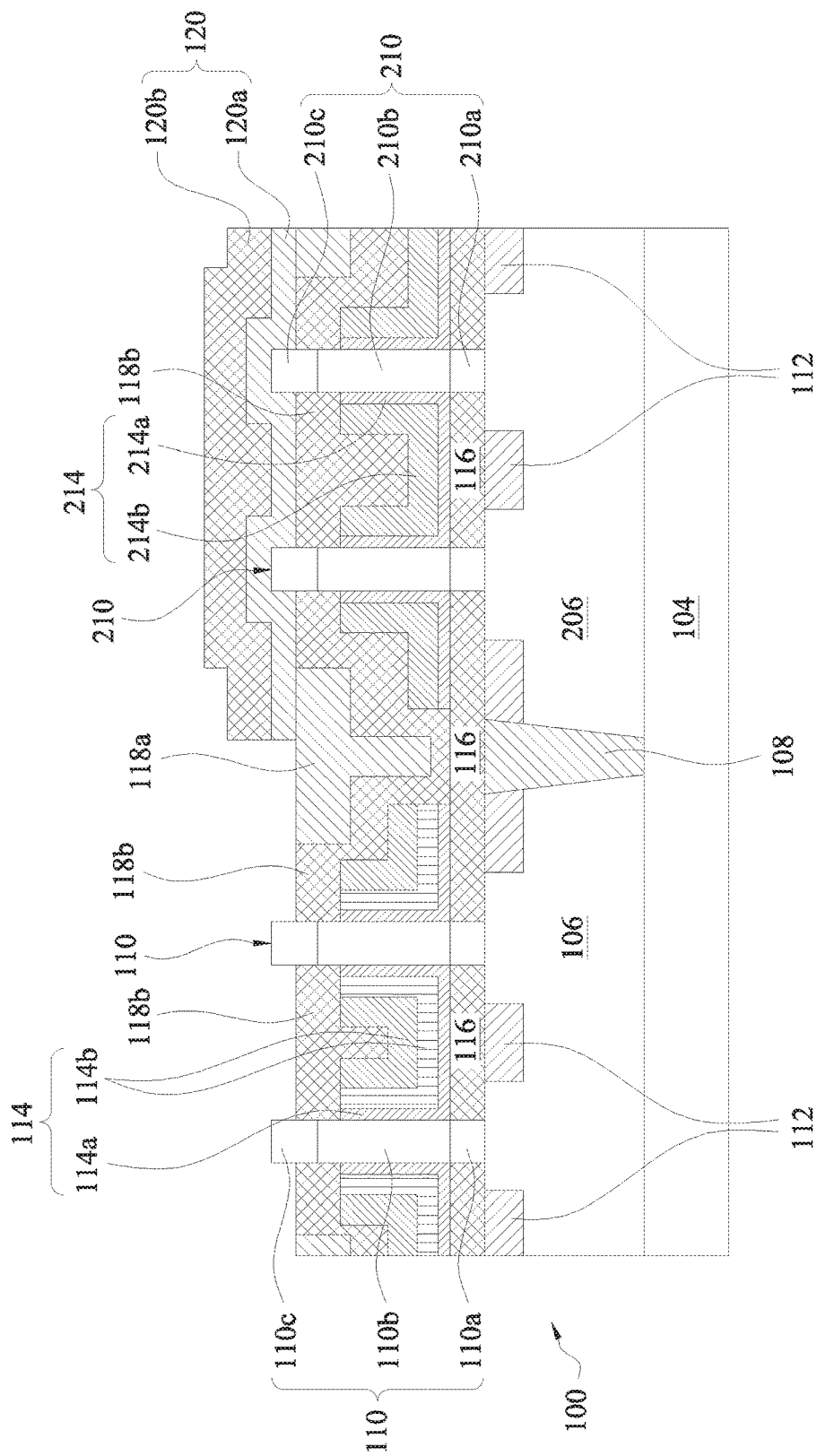

Once the first hard mask 120 has been formed, a portion of the first hard mask 120 may be removed in order to expose the drain layers 110c of the first protrusions 110c, while keeping the drain layers 210c of the second protrusions 210c covered. In other words, the first hard mask 120 may be patterned to expose sidewalls of the drain layers 110c of the first protrusions 110c and portions of the second spacer layer 118 disposed over the first gate stacks 114, while a remaining portion of the first hard mask 120 continues to cover sidewalls of the drain layers 210c of the second protrusions 210c and portions of the second spacer layer 118 disposed over the second gate stacks 214. This step is illustrated in FIG. 1C. In an embodiment, a masking and etching process (e.g. dry and/or wet etch process) may be used to expose sidewalls of the drain layers 110c of the first protrusions 110c and portions of the second spacer layer 118 disposed over the first gate stacks 114. However, it should be understood that other suitable methods of removing a portion of the first hard mask 120 may be utilized in other embodiments.

Figure 1D:
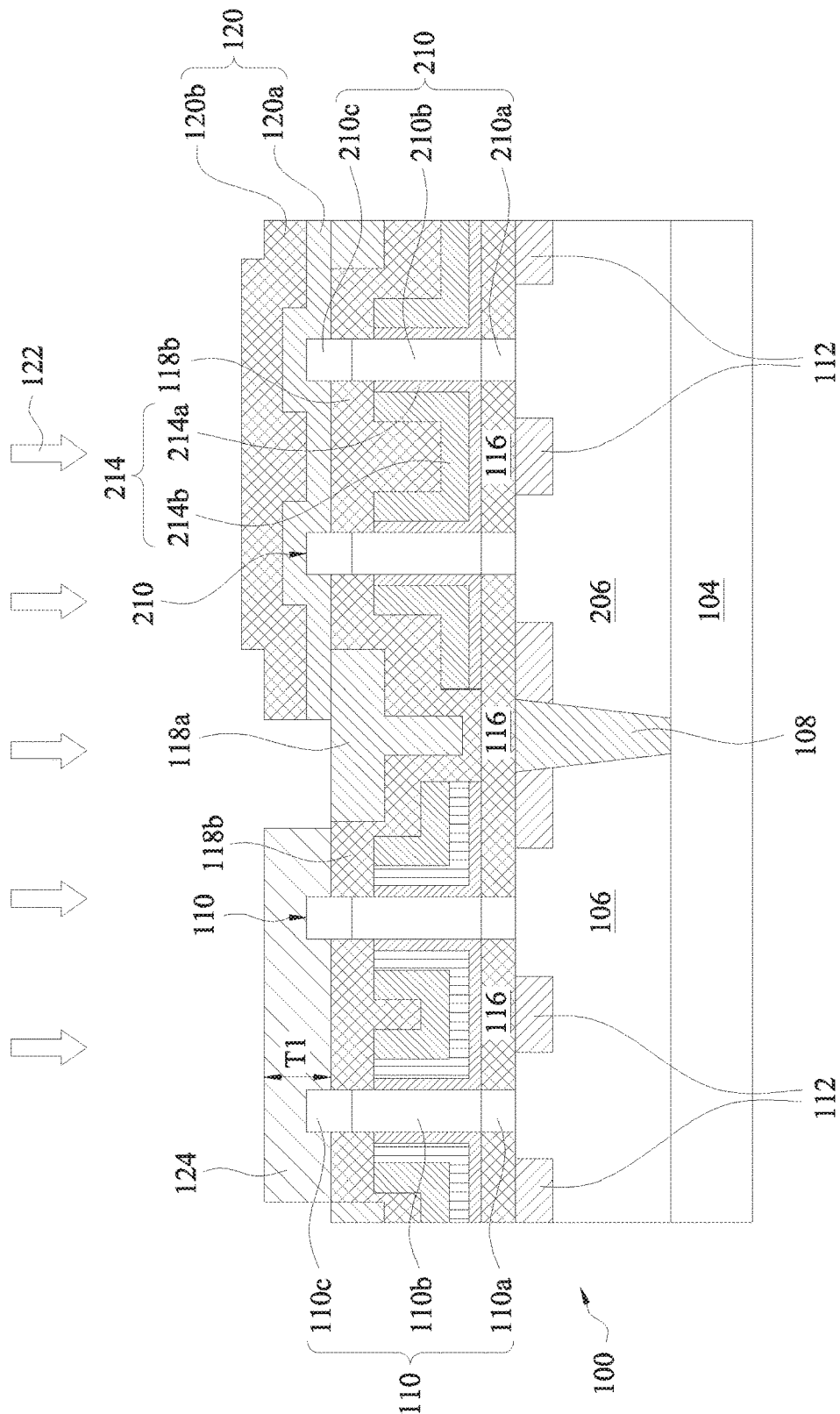

Referring to FIG. 1D, a third epitaxial growth process 122 may be performed to enlarge the drain layers 110c of the first protrusions 110, thereby forming first enlarged drain regions 124 over exposed surfaces of the drain layers 110c of the first protrusions 110. The third epitaxial growth process 122 may be a low-temperature epitaxial growth process, e.g. performed at a temperature in a range from about 400° C. to about 650° C., such as about 465° C. The third epitaxial growth process 122 may be molecular beam epitaxy (MBE), liquid phase epitaxy (LPE), vapor phase epitaxy (VPE), selective epitaxial growth (SEG), or combinations thereof. In an embodiment, the third epitaxial growth process 122 may be performed for a time duration in a range from about 2 minutes to about 90 minutes (e.g. about 15 minutes). This may result in the first enlarged drain regions 124 having a thickness T1 in a range from about 1 nm to about 50 nm (e.g. about 10 nm), although other thicknesses and time durations may be possible. The third epitaxial growth process 122 may include the use of one or more process gases and one or more carrier gases. In an embodiment, the one or more process gases may include silicon chloride hydride ($SiCl_2H_2$), silane ($SiH_4$), phosphine ($PH_3$), combinations thereof, or the like. The one or more carrier gases may include nitrogen ($N_2$) and/or hydrogen ($H_2$). Under the process conditions described above, the third epitaxial growth process 122 may have a growth rate in a range from about 0.5 nm per minute to about 3 nm per minute (e.g. about 1 nm per minute).

The first enlarged drain regions 124 may comprise doped semiconductor material having the same conductivity as the first doped region 106 and the drain layers 110c (e.g. the first conductivity). The dopant concentration of the first enlarged drain regions 124 may be substantially equal to the dopant concentration of the first doped region 106. In an embodiment, dopants are introduced into the semiconductor material of the first enlarged drain regions 124 as the semiconductor material of the first enlarged drain regions 124 is grown. The description given above in respect of introducing dopants into the semiconductor material of the first doped region 106, the source layers 110a, the channel layers 110b, and the drain layers 110c as the semiconductor material of each of these layers is grown may analogously apply to introducing dopants into the semiconductor material of the first enlarged drain regions 124 as the semiconductor material of the first enlarged drain regions 124 is grown.

Alternatively, in another embodiment, dopants may be introduced into the semiconductor material of the first enlarged drain regions 124 after the semiconductor material of the first enlarged drain regions 124 is grown. The description given above in respect of introducing dopants into the semiconductor material of the first doped region 106, the source layers 110a, the channel layers 110b, and the drain layers 110c after the semiconductor material of each of these layers is grown may analogously apply to introducing dopants into the semiconductor material of the first enlarged drain regions 124 after the semiconductor material of the first enlarged drain regions 124 is grown.

As described above, the third epitaxial growth process 122 may form semiconductor material on exposed surfaces of the drain layers 110c. These exposed surfaces of the drain layers 110c include the exposed sidewalls and top surfaces of the drain layers 110c. The growth of the semiconductor material may proceed in a lateral direction (e.g. laterally away from the sidewalls of the drain layers 110c), in a vertical direction (e.g. in a direction away from the semiconductor substrate 104), or a combination thereof (e.g. in an oblique direction).

Figures 2A, 2B:
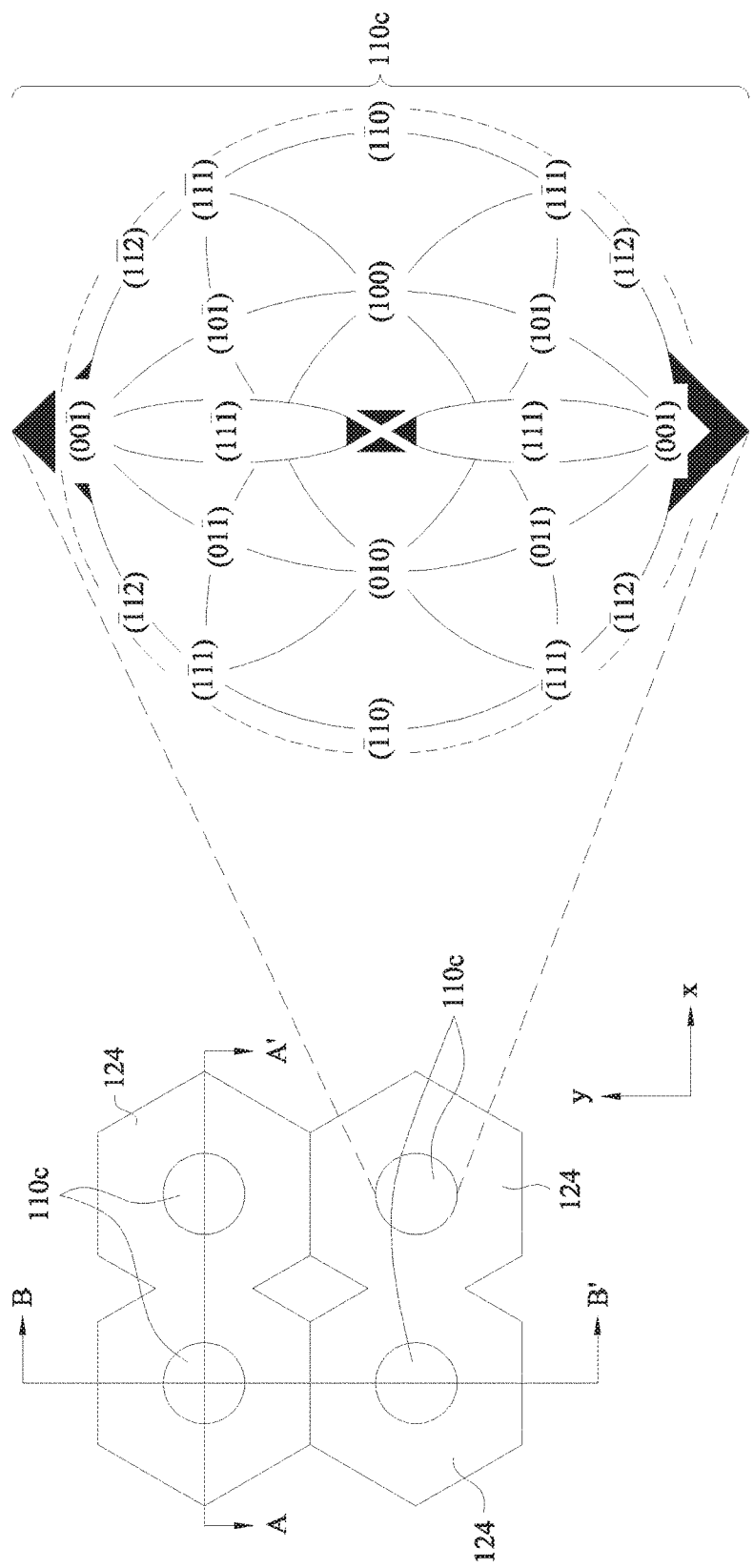
FIGS. 2A to 2D show top-down and cross-sectional views of drain layers and enlarged drain regions extending from surfaces of the drain layers, in accordance with one or more embodiments.

FIG. 2A shows a top-down view of the drain layers 110c and the first enlarged drain regions 124 in an embodiment where the first protrusions 110 are shaped as nanowires. FIG. 2B shows the orientation of the lattice planes (expressed as Miller indices) for various surfaces of one of the drain layers 110c, when the drain layer 110c is viewed in a top-down view.

The cross-sectional view of the first enlarged drain regions 124 and the drain layers 110c shown in FIG. 1D may be a taken along the line A-A' in FIG. 2A. A magnified cross-sectional view of the first enlarged drain regions 124 and the drain layers 110c of the first protrusions 110 taken along the line A-A' in FIG. 2A is illustrated in FIG. 2C. A magnified cross-sectional view of the first enlarged drain regions 124 and the drain layers 110c of the first protrusions 110 taken along the line B-B' in FIG. 2A is illustrated in FIG. 2D.

Figure 2D:
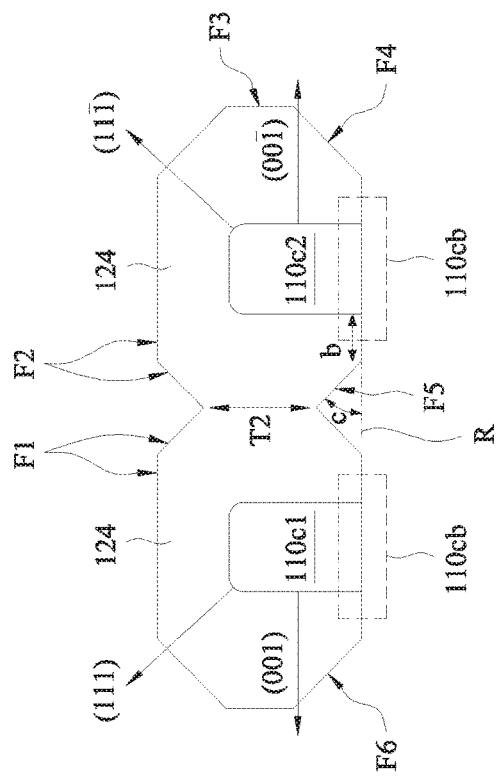
Figure 2C:
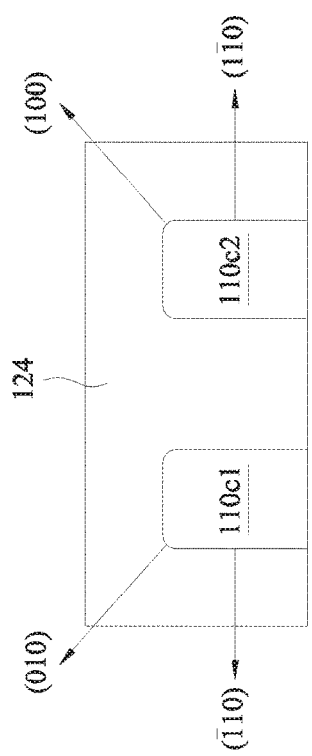

As shown in FIGS. 2B, 2C, and 2D, various surfaces of the drain layers 110c may have different lattice plane orientations. The growth of semiconductor material on a surface of the drain layers 110c may depend on the lattice plane orientation of the surface. For example, the growth rate of semiconductor material on a surface having a lattice plane orientation (100) may be greater than the growth rate of semiconductor material on a surface having a lattice plane orientation (110). Furthermore, the growth rate of semiconductor material on a surface having a lattice plane orientation (110) may be greater than the growth rate of semiconductor material on a surface having a lattice plane orientation (111). For example, for the third epitaxial growth process 122, the growth rate of semiconductor material on a surface having a lattice plane orientation (110) may be in an upper range of the aforementioned range of about 0.5 nm per minute to about 3 nm per minute (e.g. about 1.5 nm per minute to about 3 nm per minute), while the growth rate of semiconductor material on a surface having a lattice plane orientation (111) may be in a lower range of the aforementioned range of about 0.5 nm per minute to about 3 nm per minute (e.g. about 0.5 nm per minute to about 1.5 nm per minute). Consequently, the third epitaxial growth process 122 may cause semiconductor material to grow on exposed surfaces of the drain layers 110c such that the first enlarged drain regions 124 comprise various facets (or faces) F1 to F6 (shown in FIG. 2D) having various orientations and subtending various angles with respect to a reference line R (e.g. a horizontal reference line). As an example, facets F4, F5, and F6 of the first enlarged drain regions 124 proximal bottom regions 110cb of the drain layers 110c may extend a distance b from sidewalls of the drain layers 110c. In some embodiments, the distance b may be in a range from about 0 nm to about 50 nm, such as in a range from about 10 nm to about 40 nm, e.g. about 25 nm. Furthermore, an angle c subtended between these facets F4, F5, and F6 of the first enlarged drain regions 124 and the reference line R (e.g. horizontal reference line) may be in a range from about 0 degrees to about 90 degrees, e.g. in a range from about 30 degrees to about 60 degrees, e.g. in a range from about 35 degrees to about 55 degrees.

As described above, the third epitaxial growth process 122 may be performed for a time duration in a range from about 10 minutes to about 90 minutes (e.g. about 15 minutes). Depending on this time duration, the first enlarged drain region 124 formed over exposed surfaces of a first drain layer 110c1 may or may not physically contact the first enlarged drain region 124 formed over exposed surfaces of a second drain layer 110c2 laterally adjacent to the first drain layer 110c1. For example, if the third epitaxial growth process 122 is applied for a longer duration of time (e.g. greater than about 15 minutes), the first enlarged drain region 124 formed over exposed surfaces of the first drain layer 110c1 may physically contact the first enlarged drain region 124 formed over exposed surfaces of a second drain layer 110c2 laterally adjacent to the first drain layer 110c1 (e.g. as shown in FIGS. 2C and 2D). However, in an embodiment where the third epitaxial growth process 122 is applied for a shorter duration of time (e.g. less than about 15 minutes), the first enlarged drain region 124 formed over exposed surfaces of the first drain layer 110c1 may not physically contact the first enlarged drain region 124 formed over exposed surfaces of a second drain layer 110c2 laterally adjacent to the first drain layer 110c1. In the embodiment where the first enlarged drain regions 124 of adjacent drain layers 110c physically contact each other, a thickness T2 (shown in FIG. 2D) of the region at which the first enlarged drain regions 124 physically contact each other may be in a range from about 1 nm to about 50 nm, e.g. in a range from about 10 nm to about 40 nm, e.g. about 25 nm.

Figure 1E:
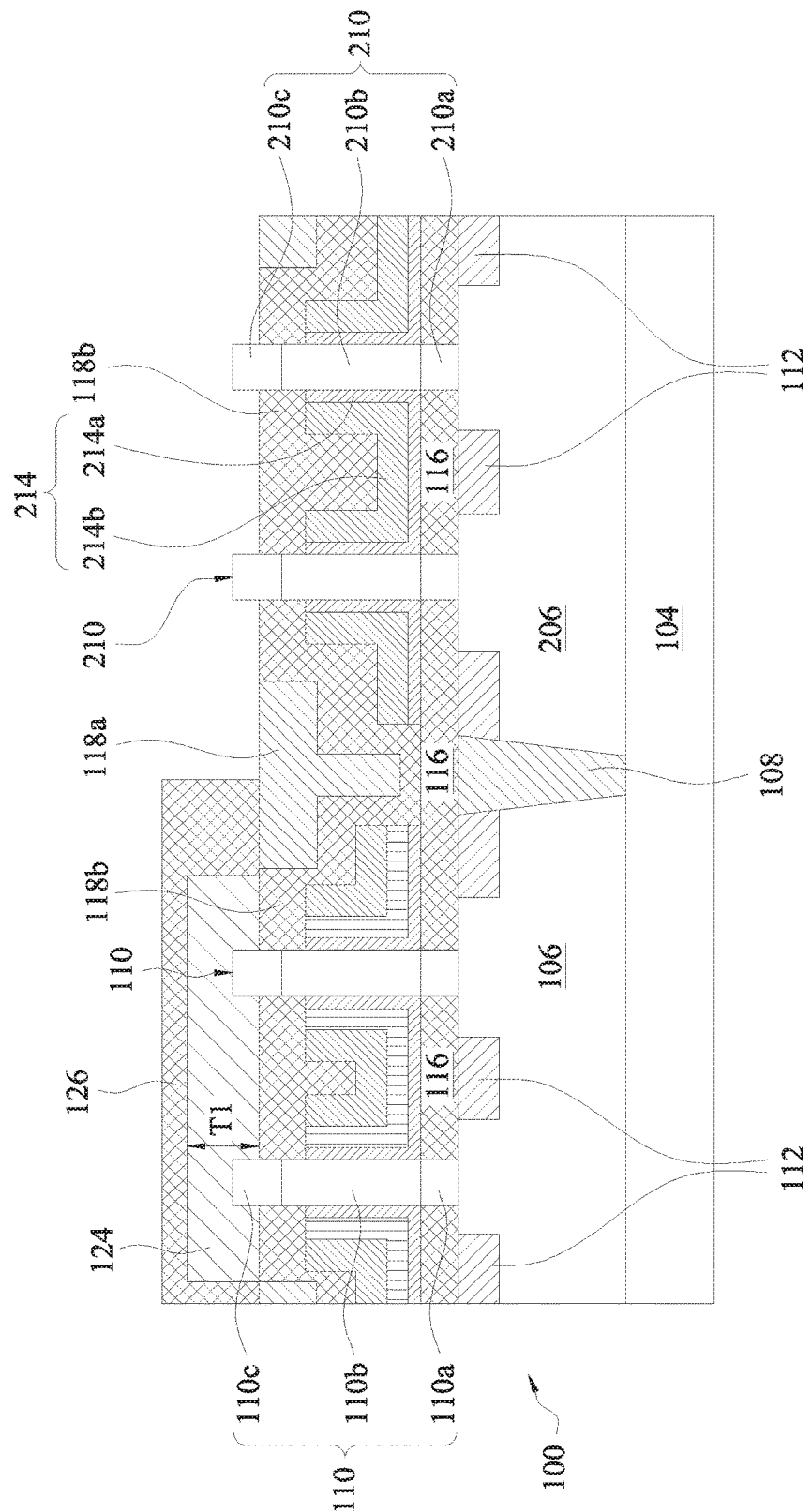

Referring to FIG. 1E, the process flow continues with masking the first enlarged drain regions 124 (e.g. with a second hard mask 126) and removing the portion of the first hard mark 120 disposed over the drain layers 210c of the second protrusions 210. This may be accomplished by depositing (e.g. by spin-on coating, chemical vapor deposition, plasma enhanced chemical vapor deposition) the second hard mask 126 over the first enlarged drain regions 124 and the portion of the first hard mark 120 disposed over the drain layers 210c of the second protrusions 210. The second hard mask 126 may comprise similar materials as the first hard mask 120. Subsequently, a planarizing process (e.g. a chemical mechanical polishing process) may be performed to planarize the second hard mask 126 and expose the portion of the first hard mark 120 disposed over the drain layers 210c of the second protrusions 210. Following this, an etching process (e.g. a wet and/or dry etch process) may be performed to remove the portion of the first hard mark 120 disposed over the drain layers 210c of the second protrusions 210, thereby exposing the drain layers 210c of the second protrusions 210, as shown in FIG. 1E. The planarizing process and the etching process performed on the first hard mask 120 are not shown in the process flow for the sake of brevity.

Figure 1F:
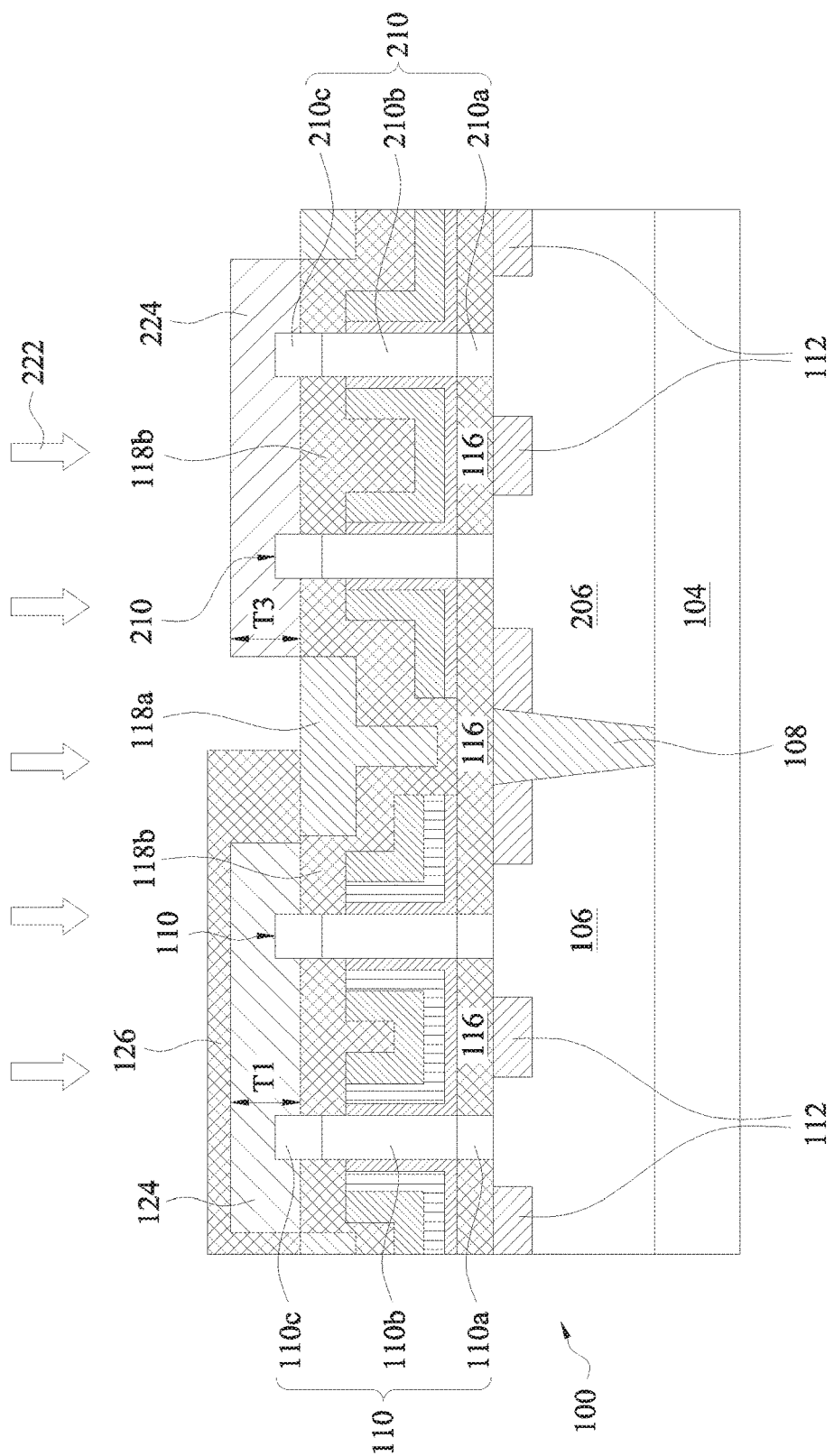

Referring to FIG. 1F, a fourth epitaxial growth process 222 may be performed to enlarge the drain layers 210c of the second protrusions 210, thereby forming second enlarged drain regions 224 over exposed surfaces of the drain layers 210c. The fourth epitaxial growth process 222 may be a low-temperature epitaxial growth process performed at a temperature in a range from about 400° C. to about 650° C., such as about 465° C. The fourth epitaxial growth process 222 may be molecular beam epitaxy (MBE), liquid phase epitaxy (LPE), vapor phase epitaxy (VPE), selective epitaxial growth (SEG), or combinations thereof. In an embodiment, the fourth epitaxial growth process 222 may be performed for a time duration in a range from about 10 minutes to about 90 minutes (e.g. about 15 minutes). This may result in the second enlarged drain regions 224 having a thickness T3 in a range from about 1 nm to about 50 nm (e.g. about 10 nm), although other thicknesses and time durations may be possible. The fourth epitaxial growth process 222 may include the use of one or more process gases and one or more carrier gases. In an embodiment, the one or more process gases of the fourth epitaxial growth process 222 may include silicon chloride hydride ($SiCl_2H_2$), silane ($SiH_4$), germane ($GeH_4$), diborane ($B_2H_6$), combinations thereof, or the like. The one or more carrier gases may include nitrogen ($N_2$) and/or hydrogen ($H_2$). Under the process conditions described above, the fourth epitaxial growth process 222 may have a growth rate in a range from about 0.5 nm per minute to about 3 nm per minute (e.g. about 1 nm per minute).

The second enlarged drain regions 224 may comprise doped semiconductor material having the same conductivity as the second doped region 206 (e.g. the second conductivity). The dopant concentration of the second enlarged drain regions 224 may be substantially equal to the dopant concentration of the second doped region 206. In an embodiment, dopants are introduced into the semiconductor material of the second enlarged drain regions 224 as the semiconductor material of the second enlarged drain regions 224 is grown. The description given above in respect of introducing dopants into the semiconductor material of the first doped region 106, the source layers 110a, the channel layers 110b, and the drain layers 110c as the semiconductor material of each of these layers is grown may analogously apply to introducing dopants into the semiconductor material of the second enlarged drain regions 224 as the semiconductor material of the second enlarged drain regions 224 is grown.

Alternatively, in another embodiment, dopants may be introduced into the semiconductor material of the second enlarged drain regions 224 after the semiconductor material of the second enlarged drain regions 224 is grown. The description given above in respect of introducing dopants into the semiconductor material of the first doped region 106, the source layers 110a, the channel layers 110b, and the drain layers 110c after the semiconductor material of each of these layers is grown may analogously apply to introducing dopants into the semiconductor material of the second enlarged drain regions 224 after the semiconductor material of the second enlarged drain regions 224 is grown.

As described above, the fourth epitaxial growth process 222 may form semiconductor material on exposed surfaces of the drain layers 210c. These exposed surfaces of the drain layers 210c include the exposed sidewalls and top surfaces of the drain layers 210c. The growth of the semiconductor material may proceed in a lateral direction (e.g. laterally away from the sidewalls of the drain layers 210c), in a vertical direction (e.g. in a direction away from the semiconductor substrate 104), or a combination thereof (e.g. in an oblique direction).

As described above in respect of the drain layers 110c of the first protrusions 110, various surfaces of the drain layers 110c may have different lattice plane orientations that can affect the growth of semiconductor material on these surfaces. In a similar manner, various surfaces of the drain layers 210c of the second protrusions 210 may have different lattice plane orientations (similar to the orientations shown in FIG. 2B). The growth of semiconductor material on a surface of the drain layers 210c may depend on the lattice plane orientation of the surface. For example, the growth rate of semiconductor material on a surface having a lattice plane orientation (100) may be greater than the growth rate of semiconductor material on a surface having a lattice plane orientation (110). Furthermore, the growth rate of semiconductor material on a surface having a lattice plane orientation (110) may be greater than the growth rate of semiconductor material on a surface having a lattice plane orientation (111). For example, for the fourth epitaxial growth process 222, the growth rate of semiconductor material on a surface having a lattice plane orientation (110) may be in an upper range of the aforementioned range of about 0.5 nm per minute to about 3 nm per minute (e.g. about 1.5 nm per minute to about 3 nm per minute), while the growth rate of semiconductor material on a surface having a lattice plane orientation (111) may be in a lower range of the aforementioned range of about 0.5 nm per minute to about 3 nm per minute (e.g. about 0.5 nm per minute to about 1.5 nm per minute). Consequently, the fourth epitaxial growth process 222 may cause semiconductor material to grow on exposed surfaces of the drain layers 210c such that the second enlarged drain regions 224 comprise various facets (or faces) having various orientations and subtending various angles with respect to a reference (much like the facets F1 to F6 of the first enlarged drain regions 124, shown in FIG. 2D). Similarly, facets of the second enlarged drain regions 224 proximal bottom regions of the drain layers 210c may extend by a distance from sidewalls of the drain layers 210c. In some embodiments, this distance may be in a similar range as the distance b described above in respect of the first enlarged drain regions 224. However, as described above, the second protrusions 210 may be a part or portion of a PMOS VGAA device. In practice, P-type epitaxial crystallization may be easier to perform that N-type epitaxial crystallization. This can result in the distance between sidewalls of the drain layers 210c and facets of the second enlarged drain regions 224 proximal bottom regions of the drain layers 210c being smaller than the above-described distance b between sidewalls of the drain layers 110c and facets of the first enlarged drain regions 124 proximal bottom regions of the drain layers 110c. However, an angle subtended between these facets of the second enlarged drain regions 224 and a reference line R may be in a similar range as and may be substantially equal to the angle c described above in relation to the first enlarged drain regions 124.

As described above, the fourth epitaxial growth process 222 may be performed for a time duration in a range from about 10 minutes to about 90 minutes (e.g. about 15 minutes). Depending on this time duration, the second enlarged drain region 224 formed over exposed surfaces of a first drain layer 210c may or may not physically contact the second enlarged drain region 124 formed over exposed surfaces of a second drain layer 110c laterally adjacent to the first drain layer 210c. In an embodiment where physical contact is made between adjacent second enlarged drain regions 224, a thickness of the region at which these second enlarged drain regions 224 physically contact may be substantially equal to the thickness T2 (shown in FIG. 2D) described above in respect of the first enlarged drain regions 124.

Figure 1G:
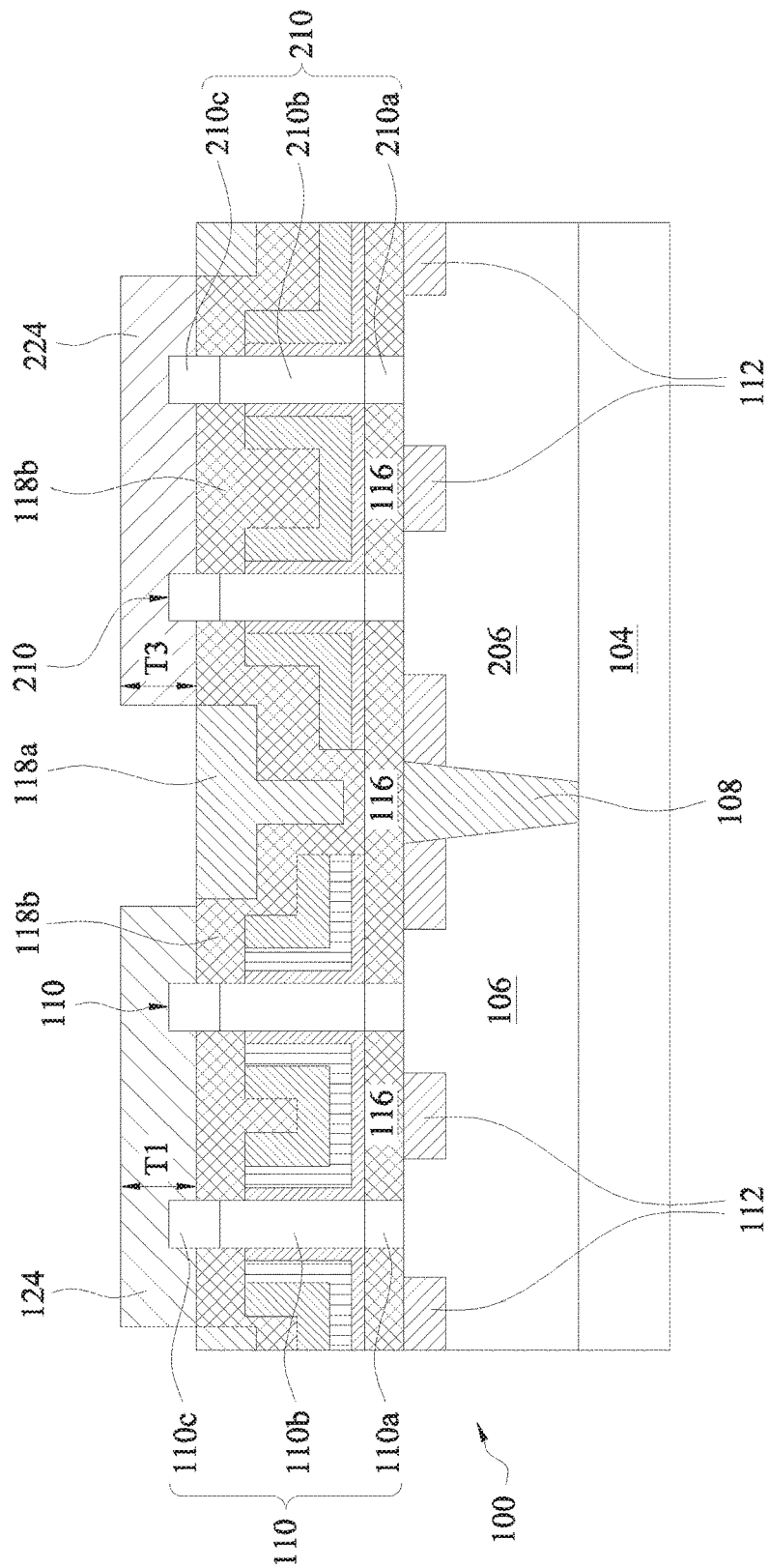

Referring to FIG. 1G, the second hard mask 126 disposed over the first enlarged drain regions 124 may be removed (e.g. by an etching process) to expose the first enlarged drain regions 124 and the second enlarged drain regions 224.

Figure 1H:
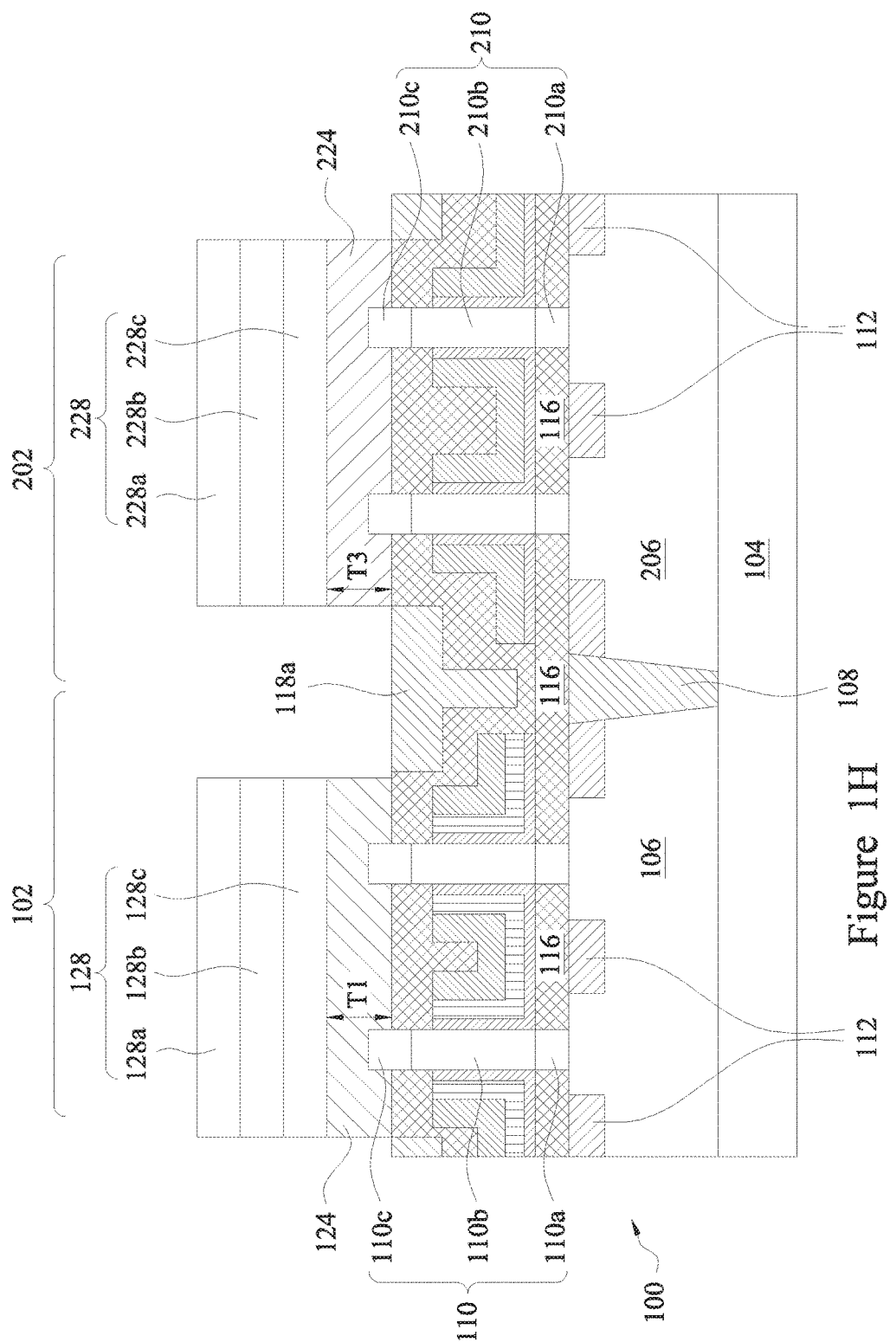

Referring to FIG. 1H, the process flow may be continued (e.g. in multiple process flow steps) to form a first drain contact 128 over the first enlarged drain regions 124, and a second drain contact 228 over the second enlarged drain regions 224. The first drain contact 128 may include a first drain silicide 128c disposed over the first enlarged drain regions 124, and first conductive layers 128b and 128a disposed over the first drain silicide 128c. The first drain silicide 128c may include similar materials as the first silicide regions 112. The first conductive layers 128b and 128a may comprise a conductive material such as copper, tungsten, or the like. The second drain contact 228 may include a second drain silicide 228c disposed over the second enlarged drain regions 224, and second conductive layers 228b and 228a disposed over the second drain silicide 228c. The second drain silicide 228c may include similar materials as the second silicide regions 212. The second conductive layers 228b and 228a may comprise a conductive material such as copper, tungsten, or the like.

Following the manufacture of the structure shown in FIG. 1H, dielectric material (e.g. comprising an oxide and/or a nitride) may be deposited over and may fully cover the first drain contact 128 and the second drain contact 228, e.g. on all sides of the first drain contact 128 and the second drain contact 228. The dielectric material fully covering the first drain contact 128 and the second drain contact 228 may, as an example, form an interlayer dielectric (ILD) layer of the semiconductor device 100.

An effect provided by the process flow illustrated in FIGS. 1A and 1H is a larger contact area between the first drain contact 128 and the drain regions of the first VGAA device 102 compared to an NMOS VGAA device where the first enlarged drain regions 124 are absent (hereinafter referred to as a conventional NMOS VGAA device only for the sake of brevity and convenience). Similarly, the process flow illustrated in FIGS. 1A and 1H leads to a larger contact area between the second drain contact 228 and the drain regions of the second VGAA device 202 compared to a PMOS VGAA device where the second enlarged drain regions 224 are absent (hereinafter referred to as a conventional PMOS VGAA device only for the sake of brevity and convenience). For example, in an embodiment where the first protrusions 110 and the second protrusions 210 are arranged as 2×3 matrices, a contact area between the first drain contact 128 and the first enlarged drain regions 124 may be in a range from about 3000 nm$^2$ to about 4000 nm$^2$ (e.g. about 3500 nm$^2$). A contact area between the second drain contact 228 and the second enlarged drain regions 224 may be in a similar range. In comparison, a contact area between the drain contact and drain regions of the conventional NMOS VGAA device and the conventional PMOS VGAA device may be in a range from about 1000 nm$^2$ to about 2000 nm$^2$ (e.g. about 1600 nm$^2$). This increase in contact area between the drain contact and drain regions of the first VGAA device 102 and the second VGAA device 202 in turn leads to lower contact resistances in the first VGAA device 102 and the second VGAA device 202 as well as a larger drain pad landing for the first VGAA device 102 and the second VGAA device 202. The larger drain pad landing for the first VGAA device 102 and the second VGAA device 202 leads to better control of drain pad enclosure windows for the first VGAA device 102 and the second VGAA device 202. It is noted that the contact resistances in the first VGAA device 102 and the second VGAA device 202 may be reduced further by judiciously selecting the semiconductor materials of the first enlarged drain region 124 and the second enlarged drain region 224. For example, in an embodiment where the semiconductor materials of the first enlarged drain region 124 and the second enlarged drain region 224 comprise both silicon and germanium, a higher germanium concentration relative to silicon can further reduce the contact resistances in the first VGAA device 102 and the second VGAA device 202. In another example, the semiconductor materials of the first enlarged drain region 124 and the second enlarged drain region 224 may be devoid of silicon and this can also result in reduced contact resistances in the first VGAA device 102 and the second VGAA device 202. As an illustration, the first enlarged drain region 124 and the second enlarged drain region 224 may comprise pure germanium, a group III-V semiconductor material, or a combination thereof (e.g. a multilayer structure comprising a layer of pure germanium and another layer of a group III-V semiconductor material). In this example, the contact resistances in the first VGAA device 102 and the second VGAA device 202 is also reduced.

Figure 3B:
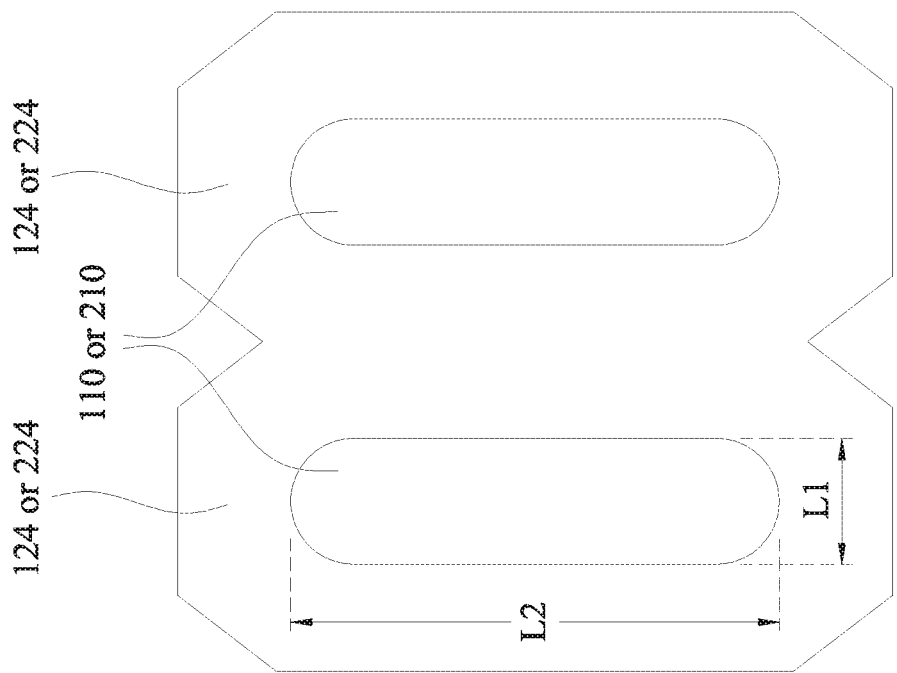
FIGS. 3A and 3B show top-down views illustrating various shapes of protrusions, in accordance with one or more embodiments.
Figure 3A:
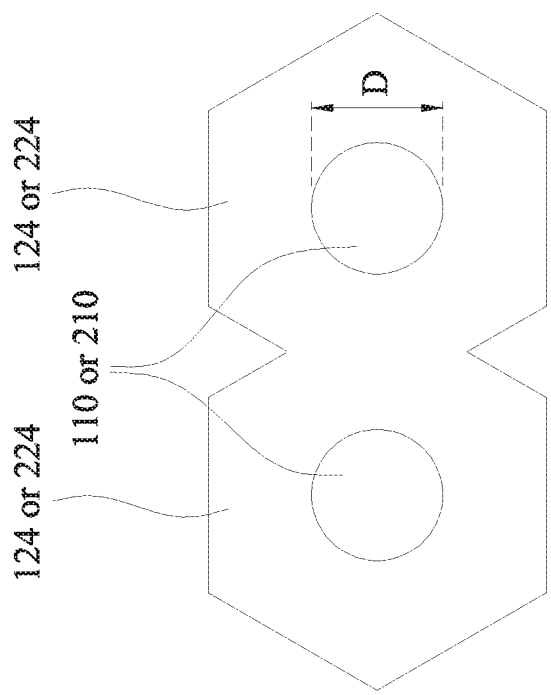

FIGS. 3A and 3B show plan views (e.g. top-down views) of the first protrusions 110 or the second protrusions 210. Also shown in FIGS. 3A and 3B are the first enlarged drain regions 124 or the second enlarged drain regions 224 formed over exposed sidewalls of the drain layers 110c or 210c, respectively. As shown in FIG. 3A, the first protrusions 110 or the second protrusions 210 may be shaped as nanowires (e.g. having a substantially circular shape) having a diameter D in a range from about 5 nm to about 20 nm, e.g. about 10 nm. In the embodiment of FIG. 3B, however, the first protrusions 110 or the second protrusions 210 may be shaped as bars or fins that have a first lateral extent L1 in a first direction and a second lateral extent L2 in a second direction substantially perpendicular to the first direction. As shown in FIG. 3B, the first lateral extent L1 is different from (e.g. smaller than) the second lateral extent L2. In an embodiment the first lateral extent L1 may be in a range from about 5 nm to about 20 nm (e.g. about 10 nm), while the second lateral extent L2 may be in a range from about 5 nm to about 2000 nm (e.g. about 60 nm). In some embodiments, the second lateral extent L2 may be larger than about 2000 nm.

According to an embodiment presented herein, a method of manufacturing a vertical gate all around device comprises: exposing a top surface and sidewalls of a first portion of a protrusion extending from a doped region, wherein a second portion of the protrusion is surrounded by a gate stack; and enlarging the first portion of the protrusion using an epitaxial growth process.

According to an embodiment presented herein, a method of manufacturing a vertical gate all around device comprises: forming a first doped region over a substrate, the first doped region having a first conductivity and a first protrusion extending away from the substrate; forming a second doped region laterally adjacent to the first doped region, the second doped region having a second conductivity different from the first conductivity and a second protrusion extending away from the substrate; exposing surfaces of a drain layer of the first protrusion, wherein a channel layer of the first protrusion is surrounded by a first gate stack; exposing surfaces of a drain layer of the second protrusion, wherein a channel layer of the second protrusion is surrounded by a second gate stack; and epitaxially growing semiconductor material over the exposed surfaces of the drain layers of the first protrusion and the second protrusion.

According to an embodiment presented herein, a vertical gate all around device comprises: a semiconductor substrate; a doped region over the semiconductor substrate; a protrusion extending from the doped region away from the semiconductor substrate, the protrusion comprising a source layer proximal the doped region, a channel layer disposed over the source layer, and a drain layer disposed over the channel layer; a gate stack encircling the channel layer of the protrusion; and an enlarged drain region disposed over a top surface and extending from sidewalls of the drain layer of the protrusion.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A semiconductor device, comprising:
   a semiconductor substrate having a doped region;
   a spacer layer over the semiconductor substrate;
   a protrusion extending from the doped region away from the semiconductor substrate, the protrusion comprising a first source/drain region adjacent the doped region, a channel region disposed over the first source/drain region, and a second source/drain region disposed over the channel region;
   a gate stack encircling the channel region of the protrusion, the gate stack being over the spacer layer; and
   an epitaxial semiconductor material disposed over a top surface and extending from sidewalls of the second source/drain region of the protrusion, the epitaxial semiconductor material having an octagonal shape in cross-sectional view.

2. The device of claim 1, wherein the epitaxial semiconductor material comprises a facet adjacent a bottom region of the second source/drain region of the protrusion, and wherein the facet is separated from the sidewalls of the second source/drain region of the protrusion by a distance less than or equal to about 50 nanometers.

3. The device of claim 2, wherein the facet is inclined at an angle in a range from about 30 degrees to about 60 degrees with respect to a horizontal reference.

4. The device of claim 1, wherein the epitaxial semiconductor material comprises pure germanium, a group III-V semiconductor material, or a combination thereof.

5. The device of claim 1, wherein a dopant concentration of the doped region and the epitaxial semiconductor material is in a range from about $1 \times 10^{19}$ cm$^{-3}$ to about $1 \times 10^{22}$ cm$^{-3}$.

6. The device of claim 1, wherein a dopant concentration of the doped region is greater than a dopant concentration of the epitaxial semiconductor material.

7. The device of claim 6, wherein the dopant concentration of the doped region is in a range from about $1 \times 10^{19}$ cm$^{-3}$ to about $1 \times 10^{22}$ cm$^{-3}$ and the dopant concentration of the epitaxial semiconductor material is less than about $1 \times 10^{18}$ cm$^{-3}$.

8. A device comprising:
a first doped region over a semiconductor substrate, the first doped region having a first conductivity;
a first protrusion extending from the first doped region;
a second doped region laterally adjacent the first doped region, the second doped region having a second conductivity different from the first conductivity;
a second protrusion extending from the second doped region;
an isolation feature disposed between the first doped region and the second doped region, the isolation feature comprising an insulating material;
a first gate stack surrounding a first portion of the first protrusion, wherein a second portion of the first protrusion is free from the first gate stack;
a second gate stack surrounding a first portion of the second protrusion, wherein a second portion of the second protrusion is free from the second gate stack;
a spacer having a first sidewall and a second sidewall, the first sidewall contacting a sidewall of the first gate stack, and the second sidewall contacting a sidewall of the second gate stack;
a first epitaxial semiconductor material surrounding the second portion of the first protrusion, the first epitaxial semiconductor material having a hexagonal shape in top-down view; and
a second epitaxial semiconductor material surrounding the second portion of the second protrusion, the second epitaxial semiconductor material having a hexagonal shape in top-down view.

9. The device of claim 8, wherein the first epitaxial semiconductor material has the first conductivity and the second epitaxial semiconductor material has the second conductivity.

10. The device of claim 8, wherein the first protrusion and the second protrusion comprise nanowires, bars, fins, or a combination thereof.

11. The device of claim 8, wherein the first epitaxial semiconductor material and the second epitaxial semiconductor material have thicknesses in a range from about 1 nm to about 50 nm.

12. The device of claim 8, further comprising a first drain contact, the first drain contact comprising:
a first drain silicide over the first epitaxial semiconductor material; and
a first conductive layer over the first drain silicide.

13. The device of claim 8, wherein:
the first protrusion comprises a first source/drain region, a second source/drain region, and a first channel region, wherein the first doped region, the first source/drain region, the second source/drain region have a dopant concentration in a range from about $1 \times 10^{19}$ cm$^{-3}$ to about $1 \times 10^{22}$ cm$^{-3}$ and the first channel region has a dopant concentration of less than about $1 \times 10^{18}$ cm$^{-3}$; and
the second protrusion comprises a third source/drain region, a fourth source/drain region, and a second channel region, wherein the second doped region, the third source/drain region, the fourth source/drain region have a dopant concentration in a range from about $1 \times 10^{19}$ cm$^{-3}$ to about $1 \times 10^{22}$ cm$^{-3}$ and the second channel region has a dopant concentration of less than about $1 \times 10^{18}$ cm$^{-3}$.

14. The device of claim 8, wherein:
the first protrusion comprises a first source/drain region, a second source/drain region, and a first channel region, wherein the first doped region and the first source/drain region have a dopant concentration in a range from about $1 \times 10^{19}$ cm$^{-3}$ to about $1 \times 10^{22}$ cm$^{-3}$, the first channel region having a dopant concentration of less than about $1 \times 10^{18}$ cm$^{-3}$, and the second source/drain region having a dopant concentration of less than about $1 \times 10^{18}$ cm$^{-3}$; and
the second protrusion comprises a third source/drain region, a fourth source/drain region, and a second channel region, wherein the second doped region and the a third source/drain region have a dopant concentration in a range from about $1 \times 10^{19}$ cm$^{-3}$ to about $1 \times 10^{22}$ cm$^{-3}$, the second channel region having a dopant concentration of less than about $1 \times 10^{18}$ cm$^{-3}$, and the fourth source/drain region having a dopant concentration of less than about $1 \times 10^{18}$ cm$^{-3}$.

15. A device, comprising:
a semiconductor substrate having a doped region;
a first protrusion extending from the doped region, the first protrusion comprising a first source/drain region adjacent the doped region, a first channel region disposed over the first source/drain region, and a second source/drain region disposed over the first channel region;
a second protrusion extending from the doped region, the second protrusion comprising a third source/drain region adjacent the doped region, a second channel region disposed over the third source/drain region, and a fourth source/drain region disposed over the second channel region;
a gate stack encircling the first channel region of the first protrusion and the second channel region of the second protrusion;
a first epitaxial semiconductor material disposed over a top surface and extending from sidewalls of the second source/drain region of the first protrusion, the first epitaxial semiconductor material having an octagonal shape in a first cross-sectional plane; and
a second epitaxial semiconductor material disposed over a top surface and extending from sidewalls of the fourth source/drain region of the second protrusion, the second epitaxial semiconductor material having an octagonal shape in the first cross-sectional plane.

16. The device of claim 15, wherein the first protrusion is adjacent to the second protrusion, and wherein the first epitaxial semiconductor material contacts the second epitaxial semiconductor material.

17. The device of claim 16, wherein a thickness of the region at which the first epitaxial semiconductor material contacts the second epitaxial semiconductor material in the first cross-sectional plane is in a range from about 1 nm to about 50 nm.

18. The device of claim 15, wherein the first epitaxial semiconductor material and the second epitaxial material have rectangular shapes in a second cross-sectional plane, the second cross-sectional plane being perpendicular to the first cross-sectional plane.

19. The device of claim 15, wherein the first epitaxial semiconductor material and the second epitaxial material have hexagonal shapes in a top-down view.

20. The device of claim 19, wherein the first protrusion is adjacent to the second protrusion, and wherein the first epitaxial semiconductor material contacts the second epitaxial semiconductor material.

* * * * *